United States Patent [19]
Gandini et al.

[11] Patent Number: 4,669,093
[45] Date of Patent: May 26, 1987

[54] PCM COMPRESSION BY ENCODING RUNS OF ZEROES

[75] Inventors: Marco Gandini; Alessandro Torielli, both Turin, Italy

[73] Assignee: Cselt-Centro Studi e Laboratori Telecomunicazioni SpA, Turin, Italy

[21] Appl. No.: 782,296

[22] Filed: Sep. 30, 1985

[30] Foreign Application Priority Data

Dec. 10, 1984 [IT] Italy ................ 68225 A/84

[51] Int. Cl.$^4$ .................. H04B 14/04; H04B 1/66
[52] U.S. Cl. .................. 375/25; 375/122; 370/118
[58] Field of Search .............. 381/30, 31, 34, 35; 358/13, 133, 138, 261; 375/25, 122; 370/7, 118; 333/14

[56] References Cited

U.S. PATENT DOCUMENTS

| 3,594,560 | 7/1971 | Stanley | 340/347 DD |
| 4,002,841 | 1/1977 | Ching et al. | 370/81 |
| 4,486,876 | 12/1984 | Gaunt, Jr. et al. | 375/30 |

Primary Examiner—Benedict V. Safourek
Assistant Examiner—M. Huseman
Attorney, Agent, or Firm—Karl F. Ross; Herbert Dubno

[57] ABSTRACT

The circuit comprises two registers (SR12, SR8) which temporarily memorize uncompressed and compressed PCM words, respectively. The uncompressed word is sequentially read and a counter (CNT) counts the number of zeroes present in the most significant positions of the absolute value of the word. The compressed word is composed, in the corresponding register, of the sign bit of the uncompressed word, followed by the counting bits of the counter and by the bits of the positions of the uncompressed word following those of the counted zeroes.

4 Claims, 1 Drawing Figure

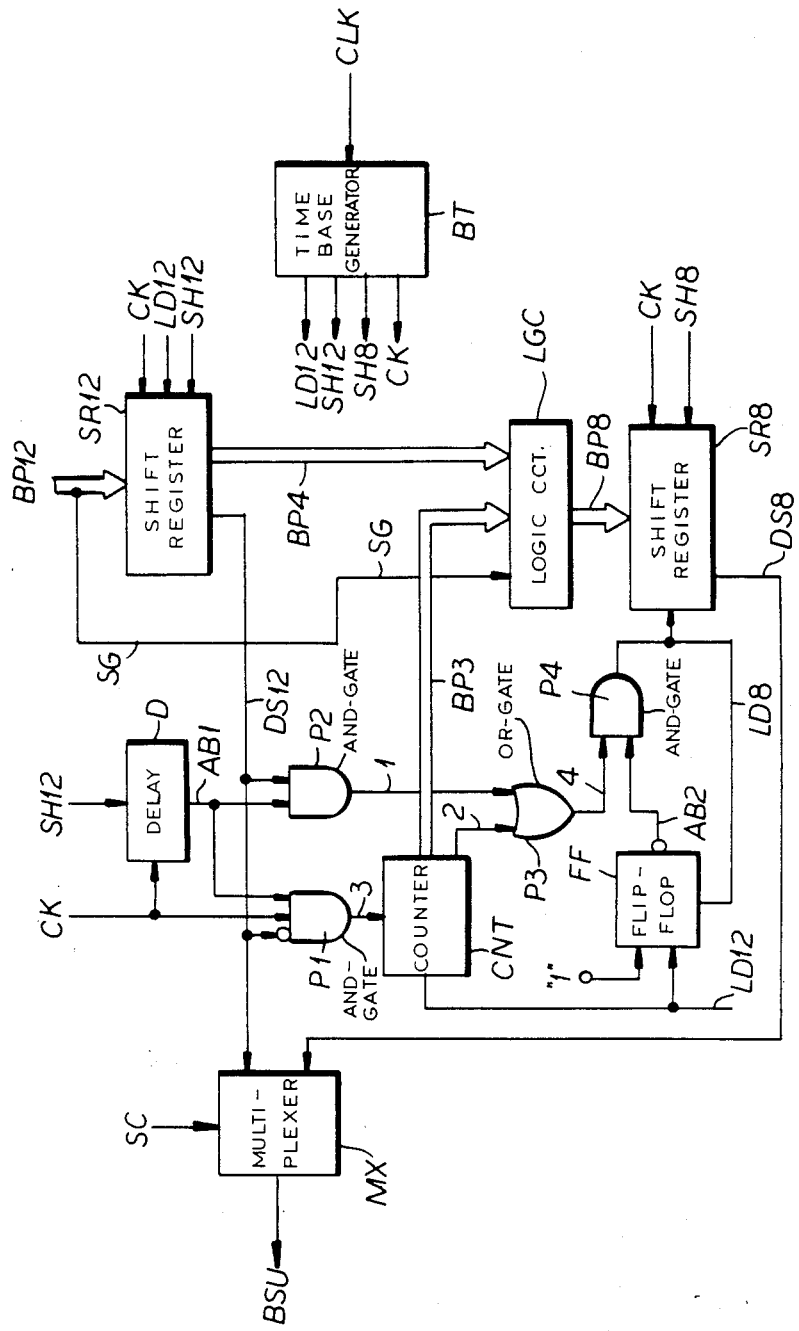

PCM COMPRESSION BY ENCODING RUNS OF ZEROES

FIELD OF THE INVENTION

The present invention relates integrated circuits and more particularly a sequential-logic integrated-circuit for PCM compression.

BACKGROUND OF THE INVENTION

PCM (Pulse Code Modulation) signal compression is a basically known operation for reduction of the number of bits of the words of the signal, prior to its transfer to a transmission line.

The logic circuits already known in the technique to carry out PCM compression are basically of the combinatory type.

If such combinatory-logic circuits were to be integrated as part of LSI integrated circuits, they ought to be implemented, according to the already known techniques, either by conveniently programmed read-only memories, or by PLA logic networks (Programmed Logic Array). Such circuit implementations entail too wide integrated circuit occupancy.

OBJECT OF THE INVENTION

It is an object of the present invention to provide an integrated circuit for PCM compression which is implemented by sequential logics and allows an area reduction in the corresponding integrated circuit by a factor of nearly 10 with respect to a combinatory logic circuit.

SUMMARY OF THE INVENTION

This object of the invention is achieved in a sequential logic integrated circuit for PCM compression comprises:

a first shift register temporarily storing PCM uncompressed words when it receives a first load signal and serially emitting them on a first wire; the register also emitting on a first bus the bits of a number of positions following the one of the bit emitted on the first wire;

a second shift register temporarily storing PCM compressed words when it receives a second load signal, and emitting them to an output;

a counter counting the number of logic 0's present in the most significant positions of the absolute value of the PCM uncompressed words it receives from the first register on the first wire, up to a maximum value and emitting a carry signal, the counter emitting on a second bus the count of the counter;

a first enabling circuit supplying the counter with the signal enabling the counter of the bits of the absolute value of PCM uncompressed words;

a second enabling circuit which supplies the second load signal to the second register when on the first wire the most significant logic "1" of the absolute value of the PCM uncompressed words is present, or when the counter emits the carry signal; the second load signal being emitted for a single-bit-duration per each PCM uncompressed word, and determining the loading in the second register of the sign bit of the PCM uncompressed word, and of the bits present respectively on the second and first bus, forming in the second register the PCM compressed word.

BRIEF DESCRIPTION OF THE DRAWING

The characteristics of the present invention will be made clearer by the following description of a preferred embodiment thereof, given by way of example and not in a limiting sense, and by the accompanying drawing, the sole FIGURE of which is a block circuit diagram of the device provided by the invention.

SPECIFIC DESCRIPTION

An example of the compression of 12-bit PCM words compressed into 8-bit PCM words will be now considered. The known algorithm used for said PCM compression is of the kind shown in the following table:

| 12-bit-uncompressed PCM words | Corresponding 8-bit-compressed PCM words |
|---|---|
| S1KYZWXXXXXX | S111KYZW |
| S01KYZWXXXXX | S110KYZW |
| S001KYZWXXXX | S101KYZW |
| S0001KYZWXXX | S100KYZW |
| S00001KYZWXX | S011KYZW |
| S000001KYZWX | S010KYZW |
| S0000001KYZW | S001KYZW |
| S0000000KYZW | S000KYZW |

According to this table, a PCM uncompressed word is formed by a sign bit S, followed by a certain number (0 to 7) of logic 0's, followed by a logic "1" (which is missing only in the last configuration of the table) and by 4 valid logic variables KYZW; the word is completed by a certain number (six to zero) of non-valid logic variables X, which don't have to be maintained, till 12 bits per word are reached.

The corresponding 8-bit compressed word is of 8 bits composed of: the sign bit S; three 1-complement coding bits of the number of zeroes following the sign bit of the uncompressed word; the four valid variables KYZW.

Besides, prior to the transfer on the line, PCM compressed words undergo a complement operation of the bits of alternate positions, according to standard PCM transmission protocol.

In the drawing SR12 denotes a normal 12-cell shift register (the cells are numbered from 0 to 11 in increasing weight order) with parallel input and serial output. When SR12 receives load signal LD12, it memorizes the 12-bit uncompressed PCM word present on input bus BP12; when, on the contrary, it receives shift signal SH12, it serially emits at the output on wire DS12 the memorized word.

Wire DS12 is connected to the output of cell 11 of the most significant position of SR12.

BP4 denotes a bus grouping the outputs of the cells 10 to 7 of SR12.

SR8 denotes a usual 8-cell shift register with parallel input and serial output. When SR8 receives load signal LD8, it memorizes the 8-bit compressed PCM words (with the bits of alternate positions complemented) present on the input bus BP8. When, on the contrary, SR8 receives shift signal SH8, it serially emits on wire DS8 the memorized word. Wire DS8 is connected to the output of the cell of the most significant position of SR8.

Registers SR12, SR8 are synchronized by clock signal CK coming from time base BT.

Time base BT, whose implementation is not a problem to the skilled worker in the art, receives the PCM-word synchronism signal on wire CLK and generates in the following order signals LD12, SH12, SH8, so that for each PCM word first the parallel storage in SR12, then the shift in SR12 and finally the shift in SR8 take place. Besides BT generates bit-frequency clock signal CK.

D denotes an ordinary delay element of a bit time for shift signal SH12, re-emitted as enabling signal AB1. D is synchronized by signal CK.

CNT denotes a modulo-8 counter supplying the counting result on bus BP3 and the possible carry bit on wire 2; said bit is emitted in correspondence with the attainment of maximum counting value. CNT receives at the reset input load signal LD12, and at the clock input signal 3, outgoing from AND gate P1, enabled by the contemporary presence of the signal outgoing from delay element D and of a logic zero on wire DS12 which is applied complemented to an input of P1.

CNT can be of two equivalent types: either a down counter programmed to logic value "111", or an up counter with counting outputs on bus BP3 complemented.

FF denotes a usual bistable circuit or set-reset flip-flop, receiving at the set input a wired logic "1", at the reset input load signal LD12, at the clock input load signal LD8, and emitting an enabling signal AB2, extracted from its complemented output.

P2 denotes an AND logic gate receiving enabling signal AB1 and the bits on wire DS12, and emitting signal 1.

P3 denotes an OR logic gate receiving signals 1 and 2, and emitting signal 4.

P4 denotes an AND logic gate receiving signals 4 and AB2 and emitting load signal LD8.

LGC denotes a logic circuit containing four conventional inverters. LGC receives the sign bit on wire SG and the bits present on buses BP3, BP4, so as to form at its inputs PCM compressed words, in accordance with the table above.

LGC supplies on bus BP8 connected to its outputs PCM compressed words, with bits of alternate positions complemented.

If one represents PCM word at the inputs of LGC with the sequence of logic variables SABCKYZW, PCM word at the LGC outputs, in the example described here is $S\overline{A}B\overline{C}K\overline{Y}Z\overline{W}$.

MX denotes a usual 2-input multiplexer for selecting the type of output of the circuit: based on the logic level of control signal SC, MX connects to the output on wire BSU either wire BS12 (uncompressed serial output) or wire BS8 (compressed serial output).

The operation of the circuit shown in the FIGURE will be now described.

Upon the arrival of a new PCM word on bus BP12, time base BT emits load signal LD12: said word is stored in register SR12, flip-flop FF resets by emitting enabling signal AB2 towards gate P4; also counter CNT is reset; it is at the moment blocked, as enabling signal AB1 is not active.

Then time-base BT emits shift signal SH12; the word just stored in SR12 is serially transmitted on wire DS12 starting from the sign bit. With a delay of a period of clock signal CK, signal SH12 appears at D output as an enabling signal (signal AB1) for the counting beginning of CNT, which takes place starting from the bit of the second position of SR12: as long as on wire DS12 there are present logic 0's, CNT increments its counting since gate P1 is enabled to transfer clock signal CK.

When, on the contrary, a logic "1" appears on wire DS12, the corresponding input of P1 goes to "0" and counting CNT is stopped.

At the same time, both P2 inputs go to "1", therefore signals 1 and 4 go to "1"; then gate P4 emits the load signal LD8 for register SR8. At that instant on bus BP4 there are present logic variables KYZW, on bus BP3 the number of zeros, expressed in 1-complement, of uncompressed PCM word flowing on wire DS12, and on bus BP8 the PCM compressed word with bits of alternate positions complemented.

Signal LD8 determines the loading in SR8 of the contents of bus BP8, as well as the switching of the output of FF which prevents successive writings in register SR8 till the arrival of a new load signal LD12.

In the last case considered in the table above, the counter attains its maximum counting value, which in 1-complement is "000", and at the same time it emits the carry signal on wire 2: then in this case the carry signal on wire 2 determines logic "1" of signals 4 and LD8, and the loading in SR8 of the word present on bus BP8.

After twelve periods of signal CK, the shift in SR12 of the uncompressed PCM word, which has flown completely on wire DS12, ceases.

Then time-base BT deactivates signal SH12 and activates shift signal SH8 which determines the serial output on wire DS8 of the word stored in SR8, which forms the PCM compressed word.

Variations and modifications are possible without going out of the scope of the invention.

We claim:

1. A sequential logic integrated circuit for PCM compression, comprising:

a first shift register temporarily storing uncompressed PCM words upon receipt of a first load signal and serially emitting said uncompressed PCM words on a first wire, said first shift register also emitting on a first bus, bits of a number of positions following the position of a bit emitted on said first wire;

a second shift register temporarily storing compressed PCM words upon receipt of a second load signal and emitting the compressed PCM words to an output;

a counter connected to said first shift register by said first wire counting the number of logic 0's present in the most significant positions of the absolute values of the uncompressed PCM words received from said first shift register on said first wire up to a maximum value and emitting a carry signal, said counter emitting on a second bus a count of said number;

a first enabling circuit supplying said counter with a signal enabling the counting of the bits of the absolute value of said uncompressed PCM words; and a second enabling circuit connected to said second shift register for supplying said second load signal to said second shift register when on said first wire the most significant logic "1" of the absolute value of said uncompressed PCM words is present, or when said counter emits said carry signal, said second load signal being emitted for a single-bit duration per each uncompressed PCM word, and determining loading in said second shift register of a sign bit of the compressed PCM word and of the bits present respectively on said second and first buses, forming in said second register said compressed PCM word.

2. The circuit defined in claim 1, wherein said first wire is connected to the cell of the most significant position of said first register, and that said first enabling circuit supplies said enabling signal to counter a bit time after said first register has begun the emission of PCM uncompressed word on said first wire.

3. The circuit defined in claim 1 wherein said second enabling circuit comprises also a bistable element which receives at the set input a predetermined logic level, at the reset input the said first load signal, at the clock input said second load signal, said bistable element a logic gate to emit said second load signal.

4. The circuit defined in claim 1, wherein at the input of said second register a logic circuit is connected which receives at the input said compressed PCM words and, prior to supplying them to said second register, complements the logic level of the bits of predetermined positions in said words.

* * * * *